United States Patent [19]
Kano

[11] Patent Number: 5,250,760
[45] Date of Patent: Oct. 5, 1993

[54] SEMICONDUCTOR DEVICE

[75] Inventor: Isao Kano, Tokyo, Japan

[73] Assignee: NEC Corporation, Tokyo, Japan

[21] Appl. No.: 795,934

[22] Filed: Nov. 15, 1991

[30] Foreign Application Priority Data

Nov. 24, 1990 [JP] Japan .................. 2-318614

[51] Int. Cl.⁵ .............................. H05K 1/00
[52] U.S. Cl. .................... 174/262; 361/808
[58] Field of Search ........... 357/71; 174/262, 265; 361/418

[56] References Cited
U.S. PATENT DOCUMENTS 4,872,050 10/1989 Okamoto et al. ............. 357/71

FOREIGN PATENT DOCUMENTS 0177251 4/1986 European Pat. Off. .
0383610 8/1990 European Pat. Off. .
0395072 10/1990 European Pat. Off. .

Primary Examiner—Leo P. Picard
Assistant Examiner—Cheryl R. Figlin
Attorney, Agent, or Firm—Laff, Whitesel, Conte & Saret

[57] ABSTRACT

A semiconductor device of a multilayer interconnection structure which includes a plurality of insulating layers and a plurality of metal interconnection layers. The uppermost metal interconnection layer is formed in a hall in the uppermost interlayer insulating layer. The uppermost interconnection layer is formed as a bonding pad portion and a part of the layer is formed into a ring-shaped portion so as to cover the side portion of the hall.

13 Claims, 5 Drawing Sheets

SEMICONDUCTOR DEVICE

BACKGROUND OF THE INVENTION

1. Field of the Invention

This invention relates to a semiconductor device and more particularly to a structure of a bonding pad portion of a semiconductor device having a multilayer metal interconnection or metallization structure.

2. Disclosure of the Prior Art

Until now, in semiconductor devices which have multilayer metal interconnection structure of this type, mainly aluminum or aluminum alloy such as Al-Cu, Al-Si-Cu or the like has been used as the metal for interconnects. However, electromigration, stress migration and any other problems have occurred as interconnecting width and pitch get shorter and smaller. To solve these problems, gold or gold alloys have been used as the metal for interconnects.

Generally, a lift-off method, an etching method, a plating method due to resist-mask or the like has been considered to realize fine gold interconnects. Lately, the plating method due to resist-mask has been often used because of its dimensional accuracy and easy process.

A brief description of that method is as follows: First, a layer of titanium, platinum or the like is formed all over an insulating layer as an electron-supplying layer. Then, a photoresist is kept remained outside of interconnection patterns by the conventional photoresist process. Thereafter, the interconnection patterns are formed by a gold plating and then the photoresist is peeled off or removed. Finally, the electron-supplying layer which remains between the interconnection patterns is removed by etching whereas the interconnection patterns serve as a mask and are unremoved. There are a few etching methods. One is a chemical etching by a wet method. Another is a dry etching or an ion milling which make use of a reverse sputtering. The most appropriate method to make fine patterns among them is the dry etching using the reverse sputtering in the atmosphere of inactive gases which makes very few side etching.

However, there are some problems on this method. In the case that the surface of the lower layers is uneven, i.e. there are steep differences in level in the lower layers, some of the electron-supplying layer tends to remain unremoved even by etching and therefore it causes a short circuit, peeling-off or tearing-off and scattering in later processes, etc.

In order to avoid the formation of the uneven surface or steep differences in level in the lower layers, it is suggested that organic insulating layers which can be formed by coating, such as polyimides that include silicon (called silicon polyimide below), or inorganic insulating layers are to be used as interlayer insulating layers.

Referring now to FIG. 1, there is shown a sectional structure of a bonding pad portion for a wire bonding of the prior art semiconductor device, wherein interlayer insulating layers are used. On a semiconductor substrate 1, formed is a first metal interconnection layer which is not shown in the figure, on which a first interlayer insulating layer 3 is formed. A second metal interconnection layer which is not shown in the figure is formed thereon and furthermore a second interlayer insulating layer 7 is formed thereon. A layer formed by plasma CVD etc. is used as the first interlayer insulating layer 3 and an insulating layer which is coated and film-formed, such as silicon polyimide etc., is used as the second interlayer insulating layer 7. Then, hall 8 is made in the second interlayer insulating layer 7 and in the hall a third metal interconnection layer 11 is formed as a bonding pad.

Referring now to FIG. 2, there is shown a structure of an another prior art semiconductor device. On a semiconductor substrate 1, formed is a first metal interconnection layer which is not shown in the figure, on which a first interlayer insulating layer 3 is formed. A second metal interconnection layer 6 is formed thereon. An inorganic insulating layer formed by CVD, plasma CVD, etc. is used as the first interlayer insulating layer 3. Then, a second interlayer insulating layer 7 is formed thereon and hall 8 is made, which exposes a part of the second metal interconnection layer 6 mentioned above. An organic insulating layer, which is coated and film-formed, such as silicon polyimide, etc. is used as the second interlayer insulating layer 7.

Then, a third metal interconnection layer 11 is formed so that it covers the hall 8 made in the second interlayer insulating layer 7, which is comprised as a bonding pad.

In FIGS. 1 and 2, a field insulating layer and an electron supplying layer are omitted.

As mentioned above, a combination of the conventional insulating layer formed by coating and an interconnecting method, by which a gold layer or electron supplying layer is easy to remain at the place where the steep difference in level exists in the lower layer or at a deep vertical gap, causes the following problems. When cracking is tried to be avoided, there is a possibility of a short circuit by peeling-off of the gold or electron supplying layer remained at the deep vertical gap. On the other hand, when a short circuit by peeling-off is tried to be avoided, there is a possibility of cracking.

For example, in FIG. 1, the third metal interconnection film 11 is formed as a bonding pad in the hall 8 of the second interlayer insulating layer 7. In this case, even if mechanical pressure or impact on bonding is applied to the third metal interconnection layer 11, the pressure is not applied to the second interlayer insulating layer 7 and thus cracking in the second interlayer insulating layer 7 can be avoided. However, in this structure, the gold-plating layer or electron supplying layer which forms the third metal interconnection layer 11 tends to remain on the side 8a of the hall 8 on etching of the third metal interconnection layer 11. Thus, there is a possibility of a short circuit by its peeling-off in the subsequent processes.

On the other hand, in the structure as shown in FIG. 2, since the third metal interconnection layer 11 is so formed as to cover the hall 8, no etching is carried out at the side 8a of the hall 8 and no peeling-off at the side 8a takes place. However, there is a possibility of cracking in the second interlayer insulating layer 7 by the mechanical pressure on bonding and it will cause the reliability of the products to be lowered.

FIGS. 1 and 2 are examples of a three-layer interconnection (metallization) structure. Not only the three-layer structure but also a two-layer or multilayer (four and more) structure causes the same problem when the use of coated and film-formed insulating layers which are easy to crack by the mechanical pressure is combined with the interconnecting technique by which the gold layer or electron supplying layer is easy to remain at the above deep vertical gap in the lower layers.

SUMMARY OF THE INVENTION

It is an object of the invention to provide a semiconductor device which has no such a problem.

The semiconductor device of the invention is so designed that the uppermost metal interconnection layer is formed in a hall made in the uppermost interlayer insulating layer to form a bonding pad portion and that a part of the metal interconnection layer is formed in the shape of a ring to cover the side of the hall.

In this case, the lower metal interconnection layer which is bigger than the hall of the interlayer insulating layer may be formed under the hall.

According to the invention, by establishing the ring-shaped portion separated from the bonding-pad portion, the residue of metal interconnection layer on etching thereof at the side of the hole of the interlayer insulating layers can be avoided. Also, cracks which occur when pressure on bonding is applied to the interlayer insulating layers can be avoided.

DETAILED DESCRIPTION OF THE PREFERRED EMBODIMENT

Next, this invention will be described with reference to the accompanying drawings.

Figure 1:
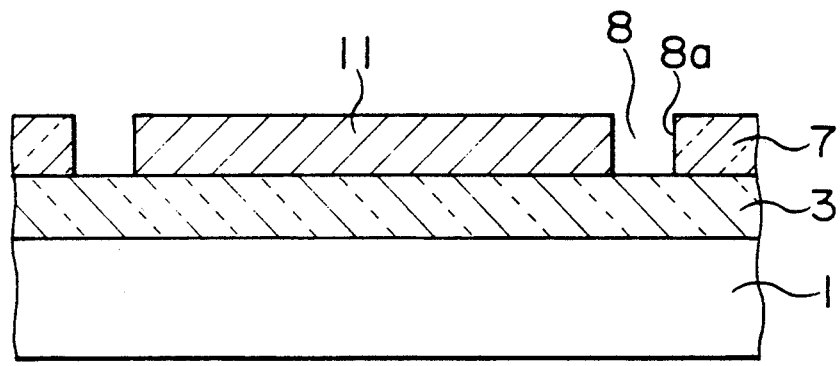
FIGS. 1 and 2 are sectional views which show different conventional structures.
Figure 2:
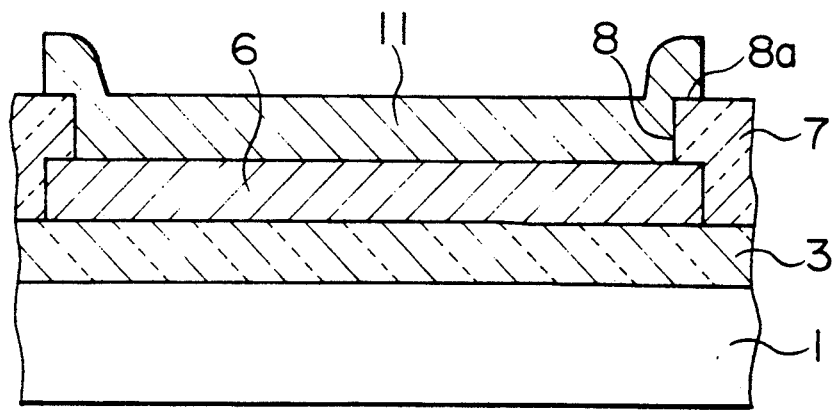
Figure 3A:
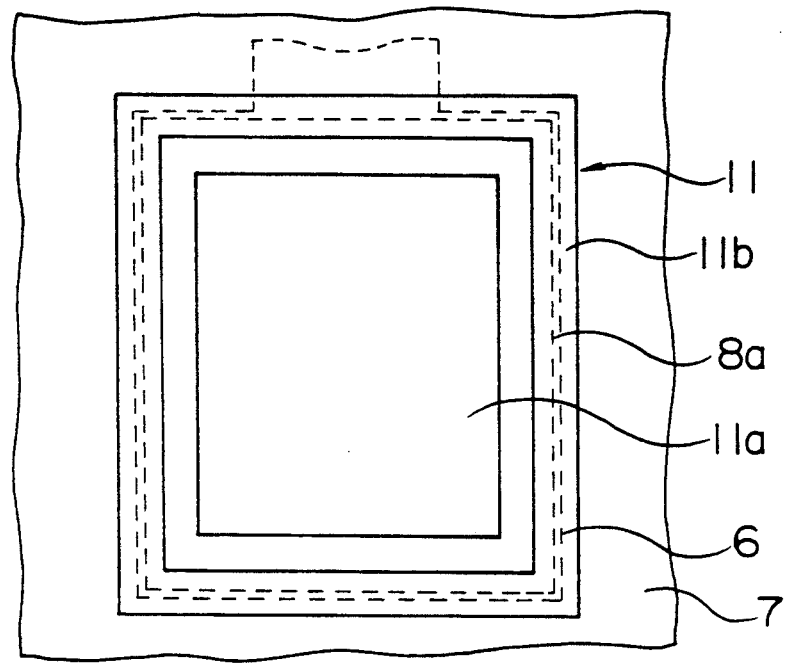
FIG. 3(a) is a plan view of a first embodiment of this invention and FIG. 3(b) is a longitudinal sectional view thereof.
Figure 3B:
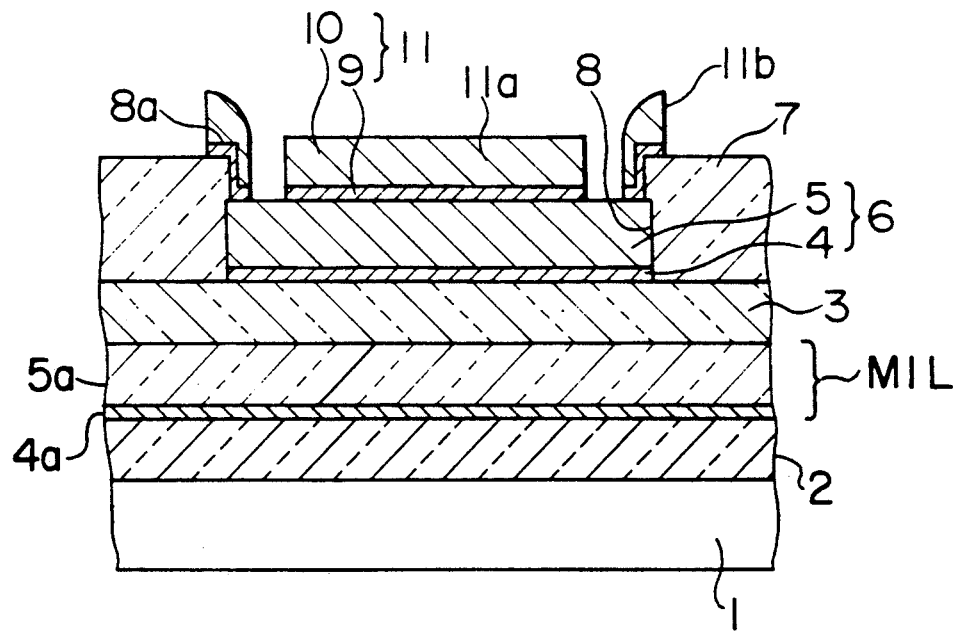

Referring now to FIGS. 3(a) and 3(b), there are shown a plan view of a first embodiment of this invention and a longitudinal sectional view thereof.

Regarding these figures, on a semiconductor substrate 1, a field insulating layer 2 is formed, on which a first metal interconnection layer MIL (layers 4a, 5a are essentially the same as layers 4, 5), not shown in the figures is formed. Then, thereon, a first interlayer insulating layer 3 is formed, on which is formed a second metal interconnection layer 6 which comprises an electron supplying layer 4 and a gold-plating layer 5. Furthermore, thereon, a second interlayer insulating layer 7 is coated and formed. In the second interlayer insulating layer 7, a hall 8 is made on the above second metal interconnection layer 6. In addition, in the hall 8 a third metal interconnection layer 11, which comprises an electron supplying layer 9 and a gold-plating layer 10, is formed as a bonding pad portion 11a. At the same time, a ring-shaped portion 11b is formed so as to cover the side 8a of the hall 8 using a part of the third metal interconnection layer 11.

Referring to FIGS. 4(a) to 4(d), there are shown sectional views which show the structure of FIG. 3 in processwise sequence.

Figure 4A:
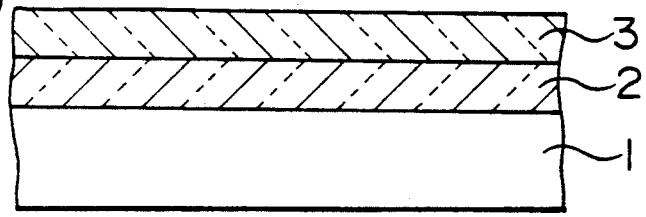
FIGS. 4(a) to 4(d) are sectional views to show the process of making the structure of the FIGS. 3(a) and 3(b)

First, as shown in FIG. 4(a), a field insulating layer 2 is formed on a semiconductor substrate 1 and on the field insulating layer 2 a first metal interconnection layer not shown in the figure is formed. Then, on it, a first interlayer insulating layer 3 is formed by CVD or plasma CVD. Concerning the first interlayer insulating layer 3, for example, approximately 1.0 $\mu$ thick layer of plasma oxide is formed. At this time, a flat and smooth surface can be made by Silica-Coating, Etching-Back, etc.

Figure 4B:
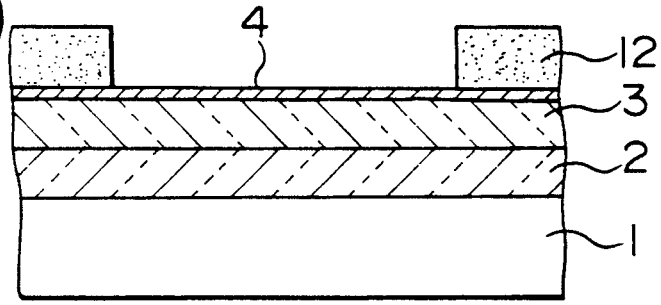

Second, as shown in FIG. 4(b), after an electron supplying layer 4 is formed over a whole surface, a photoresist pattern 12 for a plating is formed around the area for a bonding pad. A combination of Pd, Pt, Au or the like and Ti, TiW, TiN or the like is chosen as the electron supplying layer 4, considering the adhesion to the lower layer and the easiness of plating. When a composition of a second metal interconnection layer mentioned below is different from that of a third metal interconnection layer mentioned below, it is necessary to consider the extent of the barrier.

Figure 4C:
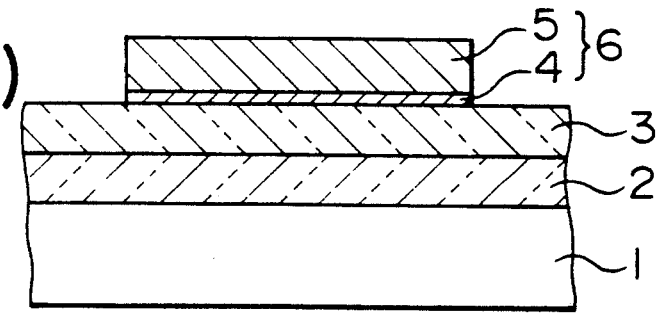

Third, as shown in FIG. 4(c), a gold-plating layer 5 is formed using the above-mentioned photoresist 12 for a mask to form a second metal interconnection layer 6, a part of which is processed as a ground part of a bonding pad to a required pattern. Then, after the photoresist 12 is removed, unnecessary part of the electron supplying layer 4 is removed by etching.

Figure 4D:
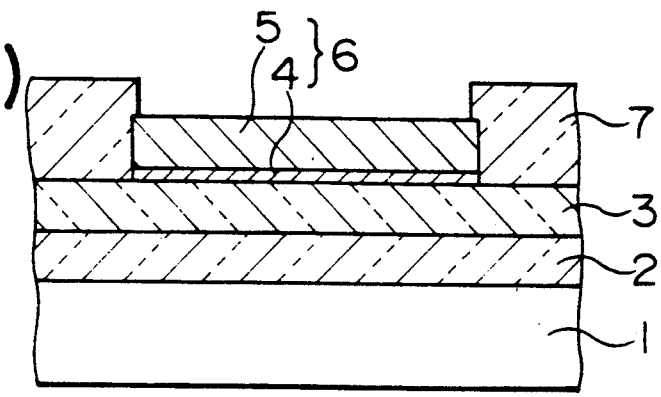

Fourth, as shown in FIG. 4(d), an insulating layer, which can be coated and formed, such as siliconpolyimide etc., is formed all over the top surface. The thickness of the layer is preferably about 1.0-1.5 $\mu$m at a flat surface portion. Or, before a formation of the coating layer, for example, an insulating layer may be formed by plasma VCD or other methods. As a result, a second interlayer insulating layer 7 is formed. Then, on it, is formed a photoresist pattern not shown in the figure and a hall 8 is made on the ground part of the bonding pad formed in the second metal interconnection layer.

Thereafter, an electron supplying layer 9 is formed over an entire surface. By using the electron supplying layer 9, a gold-plating layer 10 is formed to thereby form a third metal interconnection layer 11. Then, a pattern of the third metal interconnection layer 11 is formed by the pattern of photoresist not shown in the figure. The above is the process of the semiconductor device shown in FIG. 3.

In the above semiconductor device, the third metal interconnection layer 11 is patterned so that a bonding pad portion 11a, which is formed in the hall 8 mentioned above, is separated from a ring-shaped portion 11b, which covers a side 8a of the hall 8.

Also, another layer which covers the top surface can be formed for purposes of passivation and mechanical protection.

According to this structure, the ring-shaped portion 11b remains unetched; that is, parts besides the one covering the side 8a of the hall 8 are etched. Thus, in the third metal interconnection layer 11, there is no leftover due to etching at the side 8a of the hall 8. Also, since the bonding pad portion 11a is formed only inside the hall 8, pressure on bonding is not applied to the second interlayer insulating layer 7 and thus cracking at the second interlayer insulating layer 7 can be avoided.

It is desirable that there should be at least an 1 $\mu$m distance between the bonding pad portion 11a and the ring-shaped portion 11b although it depends on the strength of pressure on bonding.

Figure 5A:
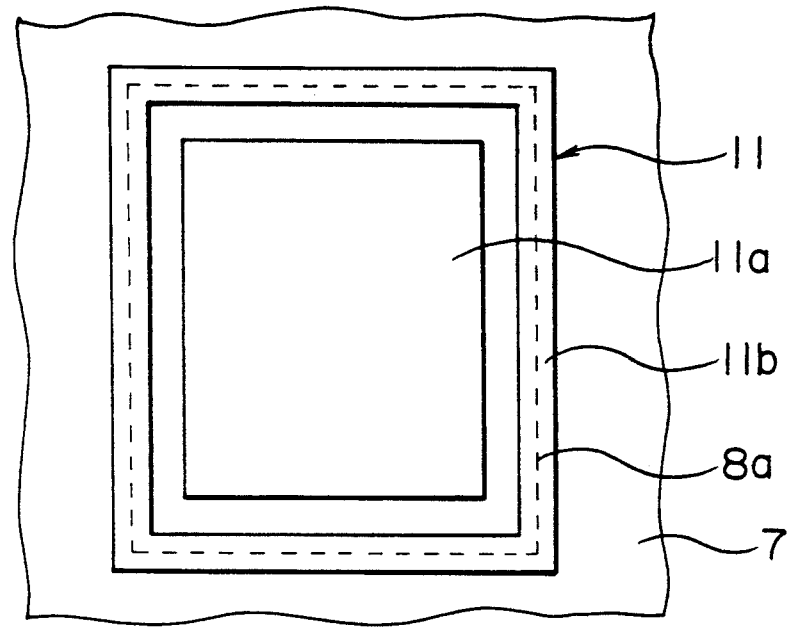
FIG. 5(a) is a plan view of a second embodiment of this invention and FIG. 5(b) is a sectional view thereof.
Figure 5B:
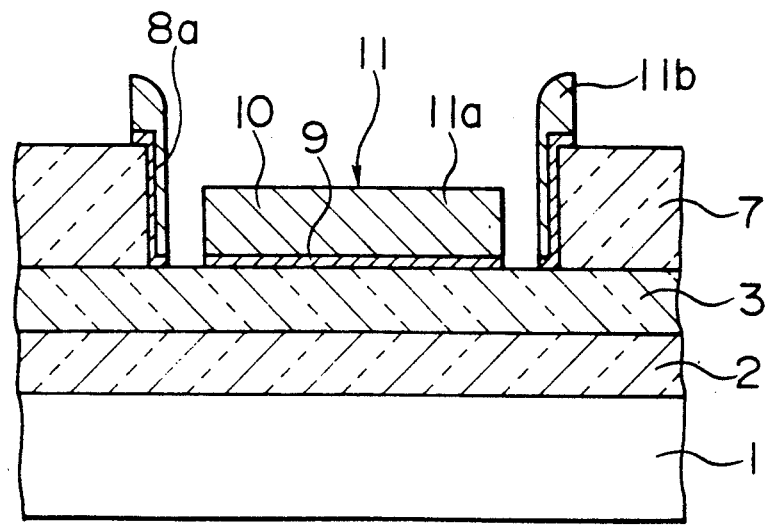

Referring now to FIGS. 5(a) and 5(b), there are shown plan and sectional views of a second embodiment of the present invention, respectively. The difference between this embodiment and the above first embodiment is that the second metal interconnection layer is not formed under the hall 8 of the second interlayer insulating layer 7 in this embodiment. In this structure, pressure which is applied to the bonding pad portion 11a on boding is not further coveyed to the second interlayer insulating layer 7 and cracking on the second interlayer insulating layer 7 can be avoided furthermore.

Figure 6A:
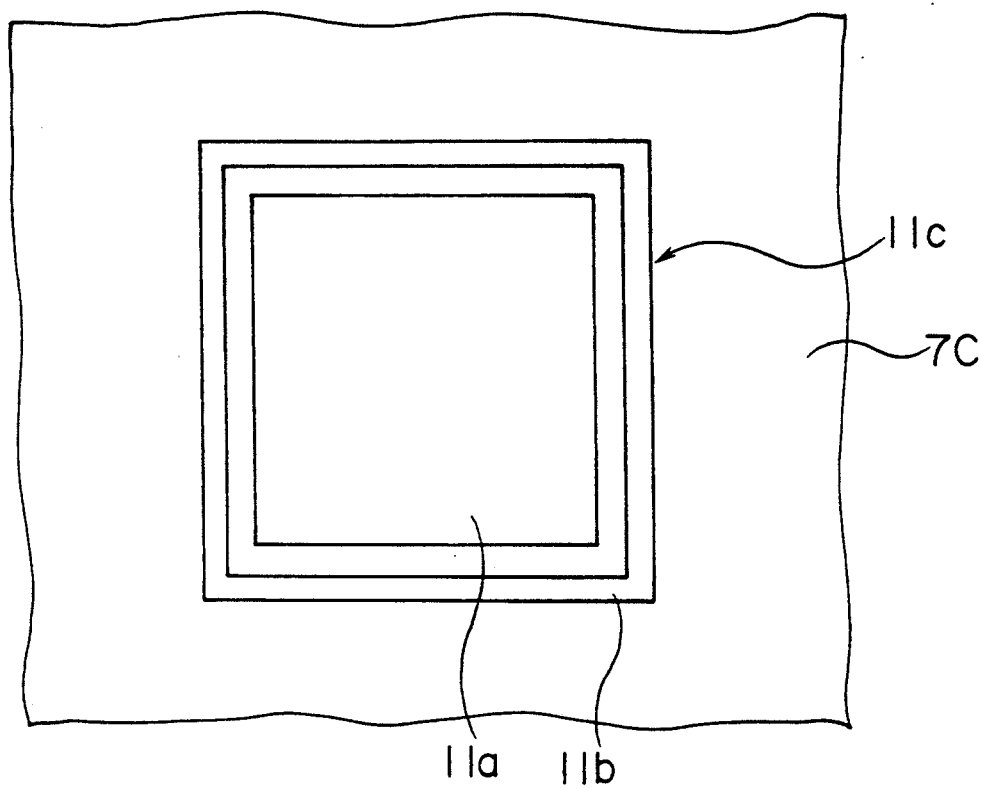
FIG. 6(a) is a plan view of a third embodiment of this invention and FIG. 6(b) is a sectional view thereof.
Figure 6B:
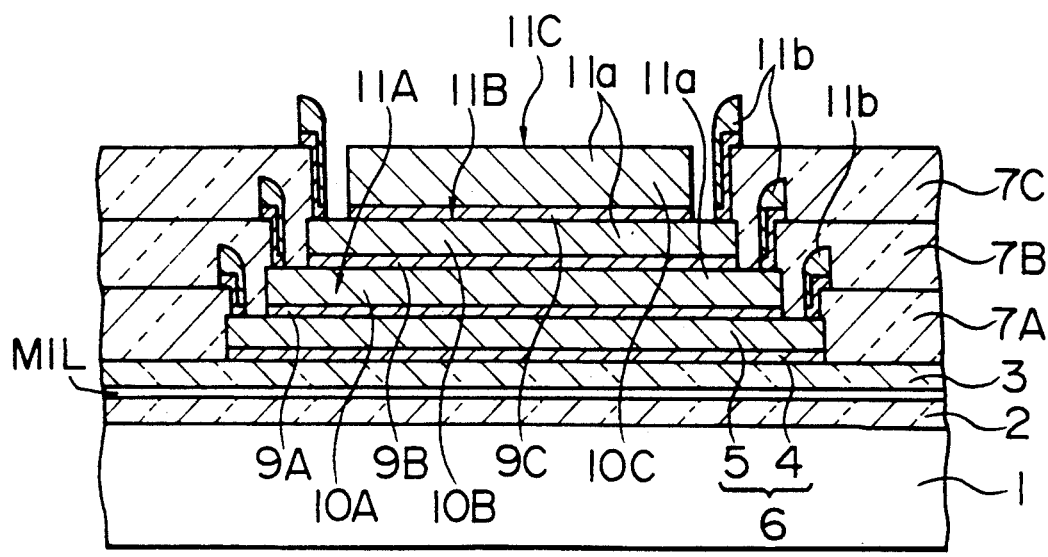

Referring to FIGS. 6(a) and 6(b), there are shown plan and sectional views of a third embodiment of the present invention, respectively. In this embodiment, the same structure as the first embodiment is repeatedly made from the second interconnection to the fifth interconnection. The heavily inked line MIL indicates layers which are the same as similarly identified layers MIL in FIG. 3b (i.e. layers 4a, 5a). In this case, the ring-shaped portion 11b, which is formed from a part of the metal interconnection layers 11A, 11B and 11C which are composed of each of electron supplying layers 9A, 9B and 9C and each of gold-plating layers 10A, 10B and 10C, are pattered so that the lower layer is in turn put in the inner place Layers 11A, 11B, 11C together from a conductive block.

In this structure, pressure on bonding is not transmitted directly to the interlayer insulating layers 7A, 7B and 7C and cracking can be avoided.

As explained above, in this invention, the bonding pad portion is formed by the formation of the uppermost metal interconnection layer or layers in the hall or halls made in the uppermost interlayer insulating layer and a part of this metal interconnection layer is formed in the shape of a ring so that it covers the side of the hall. As a result, the bonding pad portion is separated from the ring-shaped portion. Therefore, transmission of pressure applied to the bonding pad portion on bonding to the interlayer insulating layer can be avoided and cracking in the interlayer insulating layer can be avoided. Furthermore, a short circuit by the leftover of etching of the metal interconnection layer can be avoided because of the ring-shaped portion.

What is claimed is:

1. A semiconductor device having a multilayer interconnection structure which comprises a plurality of insulating layers formed by coatings, a plurality of metal interconnection layers insulated by these insulating layers, a part of the uppermost metal interconnection layer being formed as a bonding pad portion, the bonding pad portion being formed by forming the uppermost metal interconnection layer in a hall in the uppermost interlayer insulating layer, and a ring-shaped portion formed by a part of the uppermost metal interconnection layer covering the sides of the hall, the ring-shaped portion being separated from the bonding-pad portion.

2. Semiconductor device as defined in claim 1, wherein under the hall in the interlayer insulating layer, there is the lower metal interconnection layer which is bigger than the hall.

3. Semiconductor device as defined in claim 1 or 2, wherein distance between said bonding pad portion and said ring-shaped portion is at least 1 μm.

4. A semiconductor device comprising:
 a. a substrate;
 b. a field insulating layer on an upper surface of said substrate;
 c. a first metal interconnection layer on an upper surface of said field insulating layer;
 d. a first interlayer insulating layer formed on an upper surface of said first metal interconnection layer;
 e. a second metal interconnection layer formed on an upper surface of said first insulating layer;
 f. a second interlayer insulating layer having a hall on the upper surface of said second metal interconnection layer, and being formed on a part of the upper surface of said second metal interconnection layer and a part of the upper surface of said first interlayer insulating layer;
 g. a third metal interconnection layer having a bonding pad portion formed on an upper surface of said second metal interconnection layer; and
 h. a ring-shaped portion of said third metal interconnection layer covering sides of said hall, said ring-shaped portion being separated from said bonding pad portion.

5. A semiconductor device as defined claim 4, wherein said third metal interconnection layer comprises an electron supplying layer and a gold-plating layer.

6. A semiconductor device comprising:
 a. a substrate;
 b. a field insulating layer on an upper surface of said substrate;
 c. a first metal interconnection layer on an upper surface of said field insulating layer;
 d. a first interlayer insulating layer formed on an upper surface of said first metal interconnection layer;
 e. a second interlayer insulating layer having a hall on part of the upper surface of said first interlayer insulating layer in hall of said second interlayer insulating layer, and being formed on a part of the upper surface of said first interlayer insulating layer;
 f. a second metal interconnection layer having a bonding pad portion formed on an upper surface of said first interlayer insulating layer; and
 g. a ring-shaped portion of said second metal interconnection layer covering sides of said hall, said ring-shaped portion being separated from said bonding pad portion.

7. A semiconductor device as defined claim 6 wherein said second metal interconnection layer comprises an electron supplying layer and gold-plating layer.

8. A semiconductor device comprising:
 a. a substrate;
 b. a field insulating layer on an upper surface of said substrate;
 c. a first metal interconnection layer on an upper surface of said field insulating layer;
 d. a first interlayer insulating layer formed on an upper surface of said first metal interconnection layer;
 e. a second metal interconnection layer formed on an upper surface of said first interlayer insulating layer;
 f. a second interlayer insulating layer formed on a part of the upper surface of said second metal interconnection layer and a part of the upper surface of said first interlayer insulating layer;
 g. a third metal layer interconnection layer, a bonding pad portion of said third metal interconnection layer being formed on a part of an upper surface of said second metal interconnection layer;

h. a ring-shaped portion of said third metal interconnection layer covering sides of said second interlayer insulating layer on a part of an upper surface of said second metal interconnection layer, said ring-shaped portion being separated from said bonding pad portion of said third metal interconnection layer;

i. a third interlayer insulating layer formed on a part of the upper surface of said bonding pad portion of said third metal interconnection layer, a part of the surface of said ring-shaped portion of the third metal interconnection layer and a part of the upper surface of said second interlayer insulating layer;

j. a fourth metal interconnection layer, a bonding pad portion of said fourth metal interconnection layer being formed on a part of an upper surface of said bonding pad portion of the third metal interconnection layer;

k. a ring-shaped portion of said fourth metal interconnection layer covering sides of said third interlayer insulating layer, said ring-shaped portion being separated from said bonding pad portion of the fourth metal interconnection layer;

l. a fourth interlayer insulating layer having a hole and being formed on a part of the upper surface of the bonding pad portion of said fourth metal interconnection layer, a part of the surface of said ring-shaped portion of the fourth metal interconnection layer and a part of the upper surface of said third interlayer insulating layer;

m. a fifth metal interconnection layer, a top bonding pad portion of said fifth metal interconnection layer formed on a part of an upper surface of said bonding pad portion of the fourth metal interconnection layer; and n. the top ring-shaped portion of said fifth metal interconnection layer covering sides of said hole, said top ring-shaped portion being separated from said top bonding pad portion.

9. A semiconductor device as defined claim 8 wherein each of said second, third, fourth, and fifth metal interconnection layers comprises, respectively, an electron supplying layer and gold-plating layer.

10. Semiconductor device comprising a semiconductor substrate, an insulating layer covering said semiconductor substrate, a hall selectively formed in said insulating layer, said insulating layer having an edge portion defining said hall, a bonding pad portion formed in said hall spaced from said edge portion of said insulating layer, and a conductive layer formed along and in contact with said edge portion of said insulating layer to surround said bonding pad portion at a distance from said bonding pad portion.

11. A semiconductor device as defined in claim 10, further comprising a conductive film buried in said insulating layer, said hall being formed in said insulating layer to expose a part of said conductive film, and said bonding pad portion being formed on said part of said conductive film.

12. A semiconductor device as defined in claim 10, wherein said insulating layer includes a first insulating film and a second insulating film formed on said first insulating film, said hall being formed in said second insulating film to expose a part of said first insulating film, said second insulating film having said edge portion, and said bonding pad portion being formed on said part of said first insulating film.

13. Semiconductor device as defined in claim 10, further comprising a conductive block composed of a plurality of conductive films piled upon each other, said conductive block being buried in said insulating layer, said hall being formed in said insulating layer to expose a part of said conductive block, and said bonding pad portion being formed on said part of said conductive block.

* * * * *